(12) United States Patent
Biloiu et al.

(10) Patent No.: US 9,187,832 B2
(45) Date of Patent: Nov. 17, 2015

(54) EXTENDED LIFETIME ION SOURCE

(71) Applicant: Varian Semiconductor Equipment Associates, Inc., Gloucester, MA (US)

(72) Inventors: Costel Biloiu, Rockport, MA (US); David P. Sporleder, Billerica, MA (US); Jay Scheuer, Rowley, MA (US); Neil Bassom, Hamilton, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 280 days.

(21) Appl. No.: 13/886,683

(22) Filed: May 3, 2013

(65) Prior Publication Data

US 2014/0326594 A1     Nov. 6, 2014

(51) Int. Cl.
| | |
|---|---|
| *H01J 37/00* | (2006.01) |
| *C23F 4/00* | (2006.01) |
| *H01J 37/305* | (2006.01) |
| *H01J 27/08* | (2006.01) |
| *H01J 37/08* | (2006.01) |

(52) U.S. Cl.
CPC . *C23F 4/00* (2013.01); *H01J 27/08* (2013.01); *H01J 37/08* (2013.01); *H01J 37/3053* (2013.01); *H01J 2237/022* (2013.01); *H01J 2237/3341* (2013.01)

(58) Field of Classification Search
USPC ....................................................... 250/423 R
See application file for complete search history.

(56) References Cited

U.S. PATENT DOCUMENTS

| | | | | |
|---|---|---|---|---|
| 6,686,601 | B2* | 2/2004 | Murrell | H01J 37/3171 250/423 R |
| 7,791,047 | B2* | 9/2010 | Horsky | C23C 14/48 250/423 R |
| 8,603,252 | B2* | 12/2013 | Dimeo | C23C 14/564 134/1.1 |
| 2009/0242793 | A1 | 10/2009 | Low et al. | |
| 2010/0107980 | A1 | 5/2010 | Horsky et al. | |
| 2010/0155619 | A1 | 6/2010 | Koo et al. | |
| 2011/0240878 | A1 | 10/2011 | Benveniste et al. | |
| 2012/0235058 | A1 | 9/2012 | Sinha et al. | |
| 2013/0133690 | A1* | 5/2013 | Hirota | H01J 37/32403 134/1.1 |

OTHER PUBLICATIONS

International Search Report and Written Opinion mailed Sep. 9, 2014 for PCT Application, PCT/US2014/036558 filed May 2, 2014.
Koo, Bon-Woong, et al., Technique for Processing a Substrate, U.S. Appl. No. 13/832,578, filed Mar. 15, 2013.
Koo, Bon-Woong, et al., Technique for Processing a Substrate, U.S. Appl. No. 13/832,715, filed Mar. 15, 2013.

* cited by examiner

*Primary Examiner* — Phillip A Johnston

(57) ABSTRACT

An ion source includes an ion source chamber, a cathode disposed within the ion source chamber and configured to emit electrons to generate an arc plasma, and a repeller configured to repel electrons back into the arc plasma. The ion source chamber and cathode may comprise a refractory metal. The ion source chamber further includes a gas source configured to provide a halogen species to the ion source chamber. The reactive insert is interoperative with the halogen species to yield a first etch rate of the refractory metal material within the ion source chamber under a first set of operating conditions that is less than a second etch rate of the refractory metal material within the ion source chamber under the first set of operating conditions when the reactive insert is not disposed within the ion source chamber.

19 Claims, 4 Drawing Sheets

EXTENDED LIFETIME ION SOURCE

FIELD

Embodiments relate to the field of ion sources. More particularly, the present embodiments relate to an improved lifetime ion source for use with halogen species.

BACKGROUND

Ion sources such as indirectly heated cathode (IHC) ion sources are used to generate a variety of ion species including dopant ions that are used for implantation into semiconductor substrates to control their electronic properties. Many precursors for dopant ions contain halogen species such as fluorine ($BF_3$, $B_2F_4$, $GeF_4$, $PF_3$, $SiF_4$ etc), which can create a corrosive environment within an ion source. In particular, the lifetime of an IHC ion source is typically limited by the lifetime of the cathode and repeller components of the ion source. During operation, portions of the ion source that are exposed to halogens such as fluorine-containing species may be subject to corrosion. For example, ion source components may be constructed at least partially from tungsten that is exposed to fluorine species during operation. A halogen cycle may be established that removes tungsten from relatively colder surfaces within the ion source and redeposits the tungsten on relatively hotter surfaces, such as hot electrode surfaces or chamber walls. As a result, an uncontrollable growth of tungsten may occur on some electrode surfaces, which can result in glitching during operation of the ion source. Glitching is a phenomenon in which smooth operation of an ion source is disrupted by arcing that occurs either inside the ion source or in the ion extraction system. Glitching is exacerbated, for example, when sharp tungsten protuberances are grown on electrodes surface. Because the electric field is enhanced by orders of magnitude at the surface of protiberances, such sharp protuberances may readily generate unipolar or bipolar arc discharges (arc plasmas). Moreover, as irregular growth of redeposited metallic material proceeds, such growth may result in electrical shorting between electrodes and chamber walls of the ion source, making arc operation impossible. It is with respect to these and other considerations that the present improvements have been needed.

SUMMARY

Embodiments include improved ion sources and techniques for extending lifetime of ion sources. In one embodiment, an ion source includes an ion source chamber, a cathode disposed within the ion source chamber and configured to emit electrons to generate an arc plasma, and a repeller configured to repel electrons back into the arc plasma. The ion source chamber and cathode may comprise a refractory metal. The ion source chamber further includes a gas source configured to provide a halogen species to the ion source chamber, and a reactive insert disposed within the ion source chamber. The reactive insert is interoperative with the halogen species to yield a first etch rate of the refractory metal material within the ion source chamber under a first set of operating conditions that is less than a second etch rate of the refractory metal material within the ion source chamber under the first set of operating conditions when the reactive insert is not disposed within the ion source chamber.

In another embodiment, a method to operate an ion source comprises providing a halogen species to an ion source chamber of the ion source, where the ion source chamber comprises a refractory metal. The method also includes providing a reactive insert within the ion source chamber, the reactive insert configured to react with the halogen species to produce one or more product species, and generating an arc plasma including the reactive species in the ion source chamber, wherein the halogen gas and reactive insert are interoperative to yield a first etch rate of the refractory metal within the ion source chamber under a first set of operating conditions that is less than a second etch rate of the refractory metal within the ion source chamber under the first set of operating conditions when the reactive insert is not disposed within the ion source chamber.

DETAILED DESCRIPTION

Figure 1A:
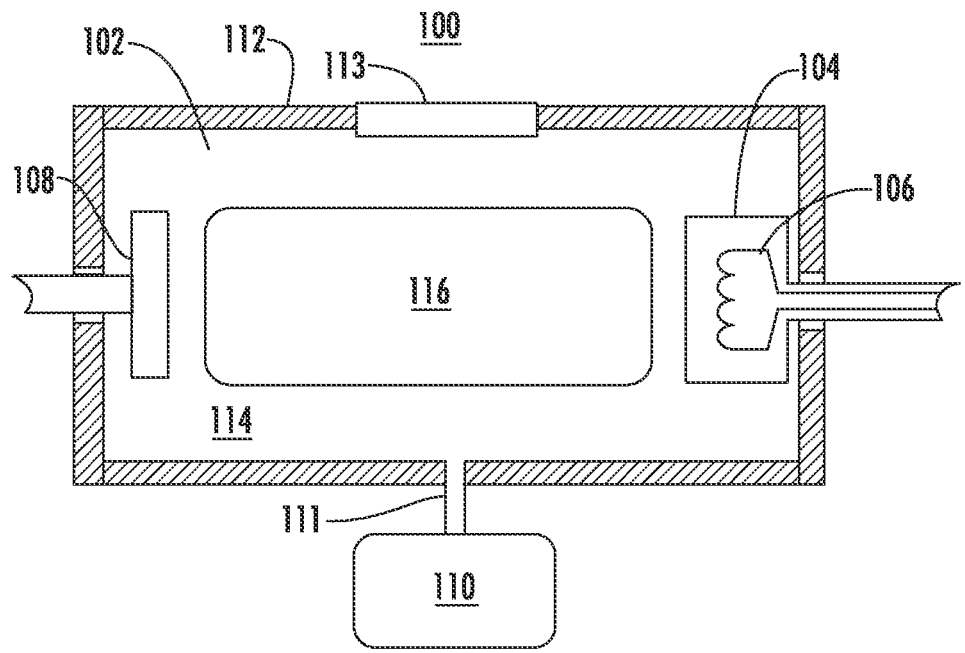
FIG. 1A depicts a side view of an exemplary ion source.

The present disclosure will now be described more fully hereinafter with reference to the accompanying drawings, in which some embodiments are shown. The subject of this disclosure, however, may be embodied in many different forms and should not be construed as limited to the embodiments set forth herein. Rather, these embodiments are provided so that this disclosure will be thorough and complete, and will fully convey the scope of the subject of this disclosure to those skilled in the art. In the drawings, like numbers refer to like elements throughout.

In various exemplary embodiments, ion sources are configured to improve performance and/or extend operating life of an ion source. Ion sources arranged according to the present embodiments include those ion sources that are constructed from refractory metal materials and designed to operate at elevated temperatures. Included among such ion sources are indirectly heated cathode (IHC) ion sources in which a cathode may operate at temperatures in excess of 2000° C., such as about 2200° C. The ion sources may be constructed, at least in part, from tungsten, molybdenum, or other refractory metal. During operation, other portions of the ion source such as the ion source chamber walls may reach temperatures in the range of 500° C. to about 1000° C., and in particular between 500° C. to about 800° C. In the present embodiments, an ion source constructed from refractory metal is provided with a reactive insert placed within the ion source chamber that is exposed to etching species generated when an arc discharge (arc plasma) is ignited within the ion source chamber. During operation of the ion source using halogen gas, a halogen species such as the halogen gas or a product of the halogen gas, the reactive insert is interoperative in conjunction with the halogen species to reduce etching of refractory metal from within the ion source chamber. The term "halogen species" as used herein refers to any halogen-containing gaseous compound and the derivative of it that might be created in the plasma. This has the beneficial effect of reducing erosion of ion source components, as well as preventing refractory metal regrowth on hot surfaces of the ion source caused by redeposition of etched refractory metal. The reduction of the refractory metal regrowth, in turn, reduces or prevents instability and/or shorting that may be otherwise generated by the regrown refractory metal deposits. As detailed below, the halogen species and/or reactive insert may be operative to generate low ionization potential gas species, where the ionization potential is below about 11 eV. This has the effect of lowering electron temperature in the arc plasma and implicitly lowering the plasma potential thus resulting in low bombarding energies of the ions crossing the sheaths in front of the arc chamber walls or in front of the arc electrodes. Low ion energy translates in reduced ion sputter yield of the refractory metal surfaces. The reactive insert may also act as a sacrificial material to generate reaction products with the halogen species and thereby reduce reaction of the halogen species with the refractory metal surfaces, so that during ion source operation etch rate of such surfaces is reduced in comparison to etch rate when the reactive insert is absent.

FIG. 1A depicts general features of an ion source 100 consistent with the present embodiments. The ion source 100 is an indirectly heated cathode (IHC) ion source that includes an ion source chamber 102, which houses a cathode 104, repeller 108, and extraction plate 112 that has an extraction slit 113. The ion source 100 also includes a filament 106 to heat the cathode 104. In operation, species such as gaseous species are provided by gas manifold 110 to the interior 114 of ion source chamber 102 through a gas inlet 111. The gas manifold 110 may provide feed material in the form of gaseous species or vapor, which is ionizable in the ion source chamber 102. Consistent with the present embodiments, suitable feed material includes one or more gaseous compounds of boron (B), carbon (C), phosphorous (P), arsenic (As), silicon (Si), hydrogen (H), and fluorine (F). The embodiments are not limited in this context.

An arc plasma 116 may be generated when the cathode 104 is heated and a potential difference (voltage) applied between ion source chamber 102 and cathode 104 and repeller 108, where the cathode and repeller are held at the same potential. The ion source 100 is coupled to various conventional components that are not depicted for clarity, including power supplies for the cathode 104 and filament 106. In various embodiments, the ion source chamber and components therein including the cathode 104 and repeller 108 are constructed from tungsten, molybdenum, or other refractory metal. In various embodiments, feed material may be supplied in the form of halogen species. For example, the ion source 100 may be employed in a conventional beamline apparatus for ion implantation of B, P, As, Si, or other species, each of which may be derived from a halogen-containing precursor species. Examples of halogen species that may be used as precursors for ions generated by the ion source 100 include $BF_3$, $PF_3$, $SiF_4$, $B_2F_4$, $GeF_4$ among other species. Moreover halogen species include products of another halogen species. For example, BF3 gas may be provided to the ion source and $BF_3$ ions, $BF_2$ neutrals, $BF_2$ ions, BF neutrals, BF ions, and F neutrals, F positive and negative ions and other heavy neutral radicals or ions $B_xF_y$ among others may all be produced through one or more processes from the parent $BF_3$ gas and are all deemed to be halogen species. The embodiments are not limited in this context.

Figure 1B:
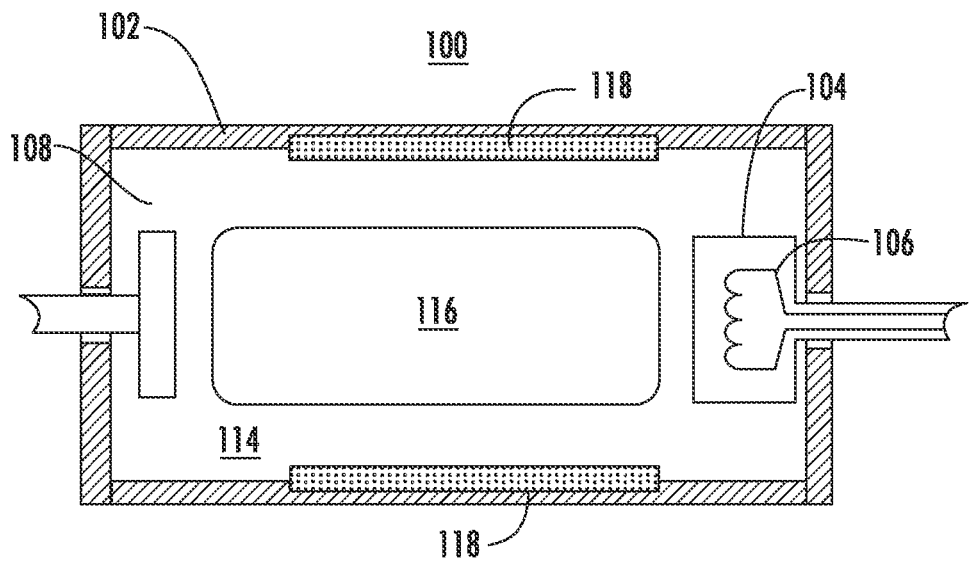
FIG. 1B depicts a top view of the ion source of FIG. 1A.

As further illustrated in FIG. 1B, the ion source 100 includes a pair of reactive inserts 118. In the embodiment depicted, a first reactive insert 118 is disposed in a first region (upper part) of the ion source chamber 102 while a second reactive insert is disposed in a second region (lower part) of the ion source chamber. In other embodiments a single reactive insert or three or more reactive inserts may be included in an ion source. Notably, in other embodiments a pair of reactive inserts may be located in a respective left region and right region of the ion source chamber 102 as viewed from the perspective of FIG. 1B. As detailed below, the reactive inserts 118 are configured to react with a halogen containing species to limit etching or erosion of refractory metal material within the ion source chamber 102. Since both cathode 104 and repeller 108 are constructed from refractory metal, this reduced erosion increases lifetime of both, which improves ion source lifetime.

In the case of an IHC ion source constructed from tungsten, the present inventors have discovered that certain combinations of materials used for the reactive inserts 118 and halogen species supplied to the ion source chamber 102 are especially effective in reducing tungsten erosion. In conventional operation, the so-called halogen cycle entails removal of tungsten atoms in the present of halogen species such as fluorine species from relatively colder surfaces, and their redeposition on relatively hotter surfaces. By providing a combination of reactive insert 118 and reactive species during operation of the ion source 100, the chemistry and energetics of the arc plasma 116 may be altered in a fashion that reduces tungsten etching.

In one set of experiments, an α-alumina ("aluminum oxide" or "$Al_2O_3$") insert consisting of a single plate was placed within a tungsten IHC ion source chamber in which a discharge was produced using different fluorinated gases. In particular, an arc plasma in the ion source was operated for 65 hours while $NF_3$ was supplied to the ion source chamber. After operation substantial tungsten deposits were observed throughout the ion source chamber including about 1-2 cm thick tungsten deposit on the surface of the cathode. In particular, in one instance, an arc plasma in the ion source was operated for 65 hours while $NF_3$ was supplied to the ion source chamber. After operation substantial tungsten deposits were observed throughout the ion source chamber including about 1-3 mm thick deposit on the surfaces of the cathode and repeller. In a second instance, an arc plasma in the ion source was operated for 120 hours under quasi-identical operating conditions but $BF_3$ was supplied to the ion source chamber. After operation little tungsten redeposition was observed.

Figure 2A:
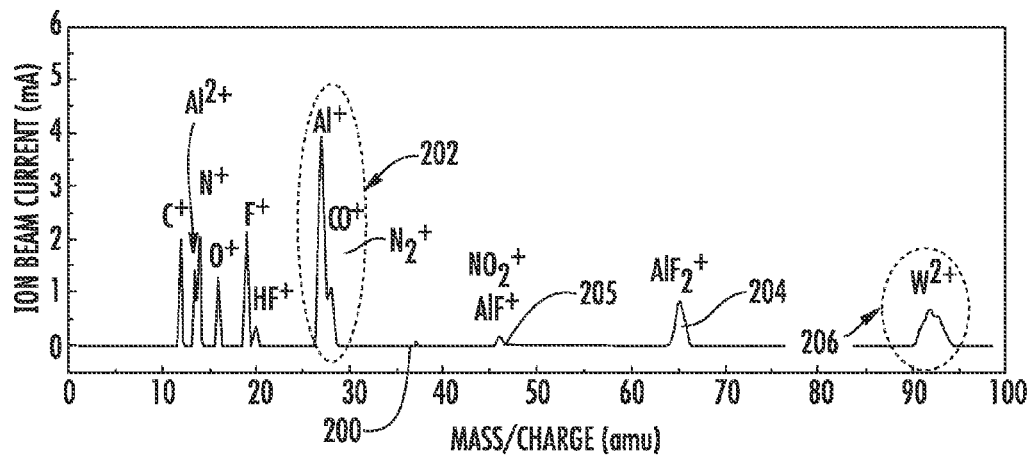
FIG. 2A depicts a mass spectrum of species produced during operation of an exemplary ion source under one set of conditions.

In further experiments, mass spectra of the extracted ion beams during operation of the ion source using both $NF_3$ and $BF_3$ based arc plasmas were collected and compared. FIG. 2A illustrates a mass spectrum 200 of ions extracted from an IHC ion source when it is fed with 2.1 sccm $NF_3$ and 0.4 sccm $H_2$ The mass spectrum, which plots ion current as a function of the ratio of ion mass/charge, is characterized by multiple peaks as labeled. These include aluminum species and byproduct species derived from the $NF_3$ precursor species. In particular, the spectral region 202 includes a peak representing a current of about 4 mA due to singly charged aluminum $Al^+$ whose mass/charge ratio is about 27 amu. The mass spectrum 200 also includes a peak 204 and peak 205 indicative of $AlF_2^+$ and AlF respectively, which may form as a result of the reaction of fluorine species derived from $NF_3$ with the $Al_2O_3$ insert. Also present in the mass spectrum 200 is a broad peak 206 (which is a convolution of six isotopes) whose peak current is about 1 mA and is attributable to $W^{2+}$. These results indicate that a substantial amount of tungsten elemental species are produced in the ion source discharge under gas flow conditions of 2.1 sccm $NF_3$ and 0.4 sccm $H_2$, in concert with the observation of large amounts of redeposited tungsten on the cathode after 65 hours operation.

Figure 2B:
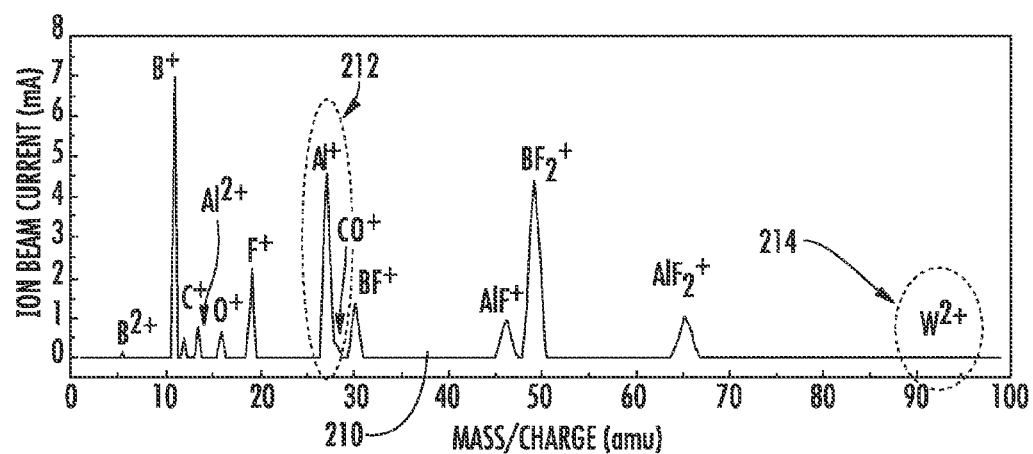
FIG. 2B depicts another mass spectrum of species produced during operation of the exemplary ion source of FIG. 2A under another set of conditions.
Figure 2C:
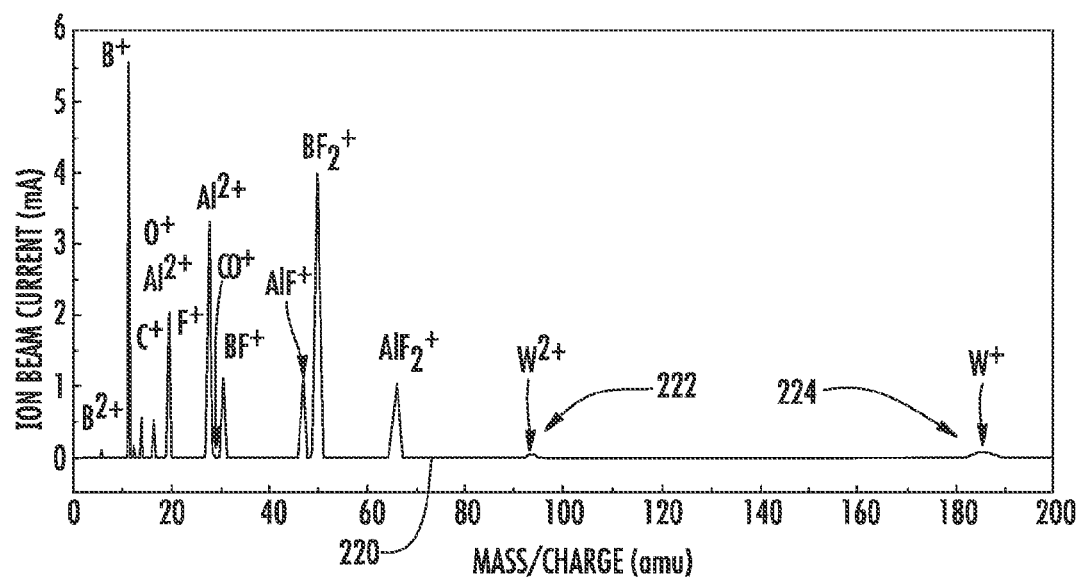
FIG. 2C depicts another mass spectrum of species produced during operation of the exemplary ion source of FIG. 2A under the set of conditions of FIG. 2B.

In contrast, FIG. 2B illustrates a mass spectrum 210 collected from ions extracted from the IHC ion source when 2.3 sccm $BF_3$ is provided to the ion source chamber. Similar to the results observed in FIG. 2A, the spectral region 212 includes a peak representing a current of about 4.5 mA due to singly charged aluminum Al whose mass/charge ratio is about 27 amu. However, the mass spectrum 210 shows a very small peak in the region 214 is attributable to $W^2$. Moreover, as shown in FIG. 2C, when an extended mass spectrum 220 was collected up to 200 amu/charge, the peaks 222 and 224, indicative of $W^{2+}$ and $W^+$, respectively, are very small with respect to the $Al^+$ peak. These results indicate that in the presence of the alumina insert, operation of an ion source under gas flow conditions of 2.3 sccm $BF_3$ yield a substantially reduced etching rate of tungsten in the ion source discharge compared with operation of an ion source under a gas flow of 2.1 sccm $NF_3$/0.1 sccm $H_2$.

These results may be explained by consideration of the energetics of elementary processes that take place when an arc plasma is ignited in an ion source. It is observed that the change between a $BF_3$ based plasma and $NF_3$ based plasma causes a substantial change in plasma density for a given set of operating conditions. This may result in a substantial change of the plasma potential and implicitly in the kinetic energy of ionic species impacting surfaces of an ion source chamber including chamber walls, repeller, cathode, and face plate. In particular, the formation of plasma in an arc plasma entails a balance between charge density in the plasma and the plasma potential with respect to the chamber and electrodes potential. Notably, the plasma is electrically quasi-neutral which means the number of ions is equal with the number of electrons. When plasma density is relatively low the difference in potential between the plasma plume (arc plasma) and the cathode potential (called "cathodic fall") is relatively high. As the plasma density decreases, the cathodic fall adjusts to become larger, thereby leading to higher kinetic energy of ions leaving the plasma plume. This fact results in higher secondary electron emission from the cathode under ion bombardment. The increased electron emission, in turn, allows the plasma to maintain a dynamic equilibrium. If plasma density is relatively high, the cathodic fall becomes relatively small. In such a case, to maintain the equilibrium, the smaller ion energy imparted to ions accelerated from the plasma to the cathode is compensated by the higher number of ions that bombard the cathode.

The change in plasma properties between a $BF_3$ plasma and $NF_3$ plasma may be explained at least in part by the difference in ionization potentials of generated species in the $BF_3$ plasma as opposed to the $NF_3$ plasma. Table I. illustrates ionization energies for several species of interest in $BF_3$ plasmas and $NF_3$ plasmas. Unless otherwise noted, the term "ionization energy" as used herein refers to the first ionization energy. In a $BF_3$ plasma, the $BF_3$ molecules may dissociate into $BF_2$, BF, and B, among other species. As illustrated in Table I, each of these dissociation product species has an ionization energy in the range of 8-11 eV, which is substantially lower than the ionization energy for dissociation products of an $NF_3$ plasma including F (17.42 eV0, N (14.71 eV) and $N_2$ (15.75 eV). Given the fact that ionization cross-sections differ only slightly this results in a higher ionization rate coefficient for boron dissociation products from BF3 as compared to those from $NF_3$ based plasma. This is confirmed by measurements during IHC ion source operation using an $Al_2O_3$ insert, where, for the same overall applied discharge power, a current of ~25 mA is produced for $BF_3$ based plasma and only ~16 mA for the $NF_3$ based plasma. The higher plasma density results in a smaller plasma potential and consequently smaller potential difference between plasma plume and ion source chamber surfaces as ions are accelerated from the plasma and strike surfaces in the ion source chamber, which translates into a lower ion energy of ions striking metallic surfaces of the ion source chamber. Accordingly, less sputtering of material such as tungsten may be expected in the $BF_3$ based plasma as is observed.

TABLE I

Ionization Energy of Various Species

| Specie | $\epsilon_{ioniz}$ (eV) |
| --- | --- |
| B | 8.29 |
| $BF_2$ | 9.40 |
| BF | 11.12 |
| $BF_3$ | 15.70 |
| F | 17.42 |
| N | 14.71 |
| $N_2$ | 15.75 |

It is to be noted that when an arc plasma is ignited for $NF_3$ based plasma or $BF_3$ based plasma gaseous species derived from the alumina insert itself may serve to adjust the plasma properties. For example, aluminum and aluminum fluoride products are believed to be produced in plasmas where aluminum oxide is exposed to fluorine-containing precursors. Because aluminum metal has a first ionization potential of 5.99 eV, aluminum species generated from the alumina insert may serve to increase plasma density in the $NF_3$ based plasma or $BF_3$ based plasmas when aluminum is etched from the alumina insert. However, in the presence of an $NF_3$ based plasma, where ionization thresholds for dissociation products shown above is about 15 eV or higher, the aluminum species do not exert a sufficient contribution to increase plasma density to the extent that ion energy is reduced to the point where tungsten metal sputtering is suppressed. On the other hand, the combination of alumina insert and $BF_3$, both of which yield species having ionization energies below 11 eV, is sufficient to generate a high enough plasma density and therefore lower ion bombardment energy to suppress sputtering of tungsten within the ion source chamber.

In additional embodiments, the reactive inserts 118 may be made from solid silicon. During operation of the ion source 100 the solid silicon may act as a sacrificial material that is preferentially etched by fluorinated gases or fluorine radicals, thus inhibiting the etching and deposition of tungsten or molybdenum surfaces of the ion source chamber 102. In one embodiment, the reactive inserts 118 are configured as solid silicon inserts and $BF_3$ gas is provided to the ion source chamber 102. Fluorine and fluorinated gases may readily react with silicon to produce silicon fluorides such as $SiF_2$ and $SiF_4$ each of which is a gas phase species at typical operating temperatures of the ion source chamber 102. Such $SiF_2$ and $SiF_4$ products may therefore be readily pumped out of the ion source chamber 102 during operation. Although the presence of silicon in the reactive inserts 118 inhibits the etching of tungsten material, exposed surfaces, such as tungsten surfaces in the in source chamber 102 may still react with fluorine containing gas species to some extent, yielding tungsten fluorides. The tungsten fluorides may, in turn, react with the reactive (silicon) insert 118 to produce silicon fluorides while reducing the tungsten fluorides to tungsten metal. Since the reactive inserts 118 present a silicon surface that is exposed to the arc plasma 116 during operation of the ion source 100, sputtering of the Si surface by ions from the discharge 116 may prevent a passivating layer of tungsten from forming on the reactive inserts 116. Thus, the reactive inserts 118 when configured as silicon inserts presents a continuous supply of etchable silicon that reduces the etching of tungsten or other refractory metal from surfaces within the ion source chamber 102. Accordingly, the use of a silicon material for reactive inserts 118 in concert with a gas such as $BF_3$ is effective in reducing of the etching and redeposition of refractory metal on the cathode 104, repeller 108, and elsewhere within the ion source chamber 102, thus increasing the ion source lifetime.

Figure 3:
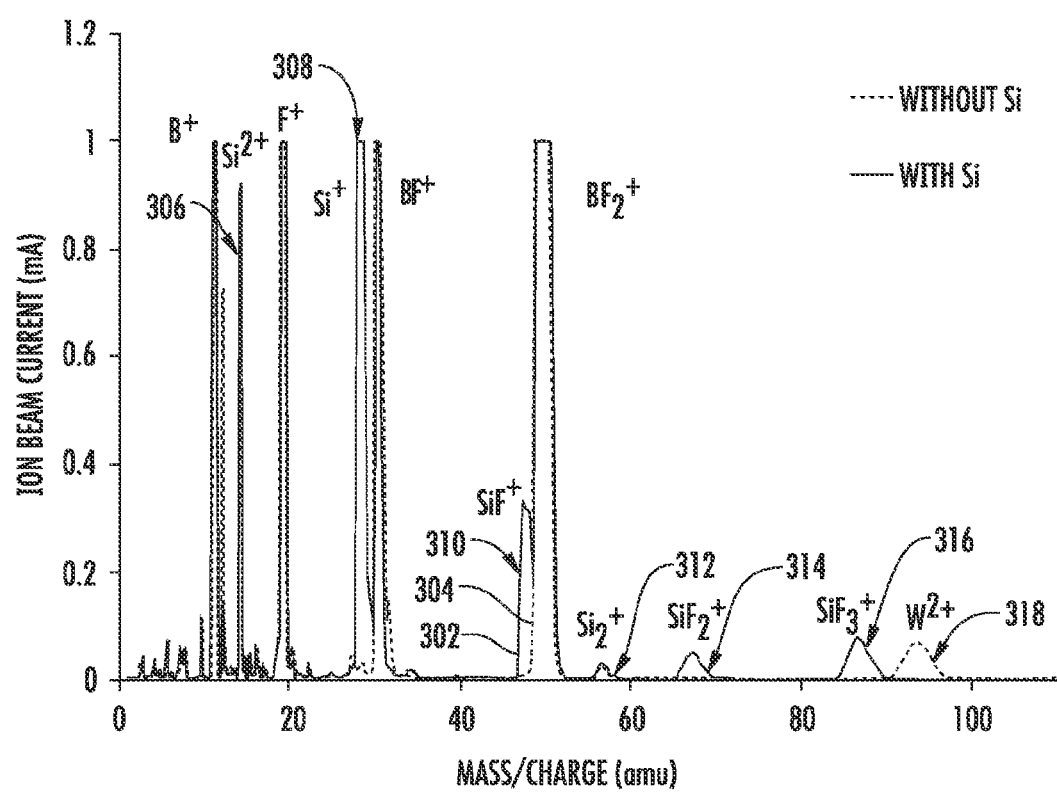
FIG. 3 depicts another mass spectrum of species produced during operation of the exemplary ion source of an exemplary ion source under an additional set of conditions.

In order to assess the effect of operating an ion source with a reactive silicon insert, a set of experiments was conducted in which mass spectra were collected from an IHC ion source during operation with and without the presence of a solid silicon insert. FIG. 3 presents results of the experiments including a mass spectrum 302 collected during IHC ion source operation with a silicon insert (continuous line) and a mass spectrum 304 collected during IHC ion source operation without a silicon insert (dashed line). Each mass spectrum includes a series of peaks representing different mass/charge ratios as described above. In particular, the mass spectrum 302 includes several peaks 306, 308, 310, 312, 314, 316 that represent silicon ions or silicon fluoride ions as shown. Each of these is not present in the mass spectrum 304 indicating that the peaks 306-316 are generated by the presence of the silicon insert. Other boron, fluorine, and boron fluoride peaks are common to both mass spectrum 302 and mass spectrum 304 and are representative of product ion species derived from the $BF_3$ gas. Moreover, the mass spectrum 304 includes a peak 318 that is not present (or greatly reduced) in the mass spectrum 302. The peak 318 may be assigned to $W^2$ thereby indicating the presence of substantial tungsten species in the arc plasma when silicon inserts are absent. The reduction of $W^2$ peak at a mass/charge ratio of about 92 amu in the mass spectrum 302 indicates that the halogen cycle is substantially suppressed by the use of the silicon inserts. An advantage of embodiments in which silicon is used as a reactive insert include the fact that in addition to reducing etching of metallic surfaces of the ion source, no additional metallic species are introduced into the arc plasma from the silicon inserts. In addition, in applications in which the ion source is to be used to implant silicon, the presence of a sacrificial silicon insert increases the supply of gas phase silicon that is ionized in an arc plasma and thereby increases the silicon beam current that can be extracted from the ion source at a given power level.

It is to be noted that in the present embodiments reactive inserts that are effective to suppress etching of refractory metal surfaces in the ion source chamber need only occupy a relatively small portion of the ion source chamber. In some embodiments the reactive insert or inserts may have a surface area A1 that is a fraction of the surface area A2 that includes of the internal walls of ion source chamber, the cathode, and repeller. In some cases A1/A2 equals about 0.01 to 0.2. Accordingly, a reactive insert or inserts whose surface area constitutes such a modest fraction of the surface area presented by refractory metal surfaces, does not require substantial redesign of other components of an ion source.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the subject matter of the present disclosure should be construed in view of the full breadth and spirit of the present disclosure as described herein.

What is claimed is:

1. An ion source, comprising:
an ion source chamber;
a cathode disposed in the ion source chamber and configured to emit electrons to generate an arc plasma within the ion source chamber, the ion source chamber and cathode comprising a refractory metal;
a repeller configured to repel electrons back into the arc plasma; and
a reactive insert disposed in the ion source chamber, the reactive insert interoperative with a halogen species introduced into the ion source chamber to suppress etching of the refractory metal during operation of the ion source.

2. The ion source of claim 1, wherein the reactive insert comprises aluminum oxide.

3. The ion source of claim 1, wherein the reactive insert comprises silicon.

4. The ion source of claim 1, wherein the halogen species comprises $BF_3$.

5. The ion source of claim 1, wherein the reactive insert is a first reactive insert disposed in a first region of the ion source chamber, the ion source further comprising a second reactive insert disposed in a second region of the ion source chamber.

6. The ion source of claim 1, wherein cathode and the repeller are disposed on opposite sides of the ion source chamber and wherein the reactive insert is disposed between the cathode and the repeller.

7. The ion source of claim 1, wherein the halogen species is configured to generate product species having an ionization threshold less than about 11 eV.

8. The ion source of claim 1, wherein the refractory metal comprises tungsten or molybdenum.

9. The ion source of claim 1, the repeller disposed opposite the cathode and constructed from refractory metal, the repeller and cathode being held at cathode potential.

10. The ion source of claim 8, wherein the reactive insert comprises a first surface area A1, wherein internal chamber walls of the ion source chamber, cathode and repeller together comprise a second surface area A2, wherein a ratio of A1/A2 is equal to about 0.01 to about 0.20.

11. The ion source of claim 1, wherein temperature of the cathode during the first set of conditions is about 2000° C. or higher and temperature of a wall of the ion source chamber comprises a temperature in the range of 500° C. to 800° C.

12. A method to operate ion source, comprising:
providing a halogen species to an ion source chamber having a refractory metal; providing a reactive insert in the ion source chamber, the reactive insert configured to react with the halogen species to produce one or more product species; and
generating an arc plasma including the halogen species in the ion source chamber, wherein the halogen species and reactive insert are interoperative to suppress etching of the refractory metal during operation of the ion source.

13. The method of claim 12, further comprising providing the reactive insert as an aluminum oxide insert.

14. The method of claim 12, further comprising providing the reactive insert as a silicon insert.

15. The method of claim 12, further comprising providing the halogen gas as $BF_3$.

16. The method of claim 12, wherein the halogen gas and reactive insert are configured to generate gaseous species having an ionization energy below about 11 eV.

17. The method of claim 12, wherein the refractory metal comprises tungsten or molybdenum.

18. The method of claim 12, further comprising providing the reactive insert with a first surface area A1, providing internal surface of the ion source chamber with a second surface area A2, wherein a ratio of A1/A2 is equal to about 0.01 to about 0.20.

19. The method of claim 12, wherein the product species comprises the halogen species and a species in the reactive insert.

* * * * *